United States Patent
Chen

(10) Patent No.: US 10,026,646 B2
(45) Date of Patent: Jul. 17, 2018

(54) PACKAGES WITH THROUGH-VIAS HAVING TAPERED ENDS

(71) Applicant: Taiwan Semiconductor Manufacturing Company, Ltd., Hsinchu (TW)

(72) Inventor: Hsien-Wei Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/668,315

(22) Filed: Aug. 3, 2017

(65) Prior Publication Data

US 2017/0330793 A1 Nov. 16, 2017

Related U.S. Application Data

(62) Division of application No. 14/206,248, filed on Mar. 12, 2014, now Pat. No. 9,735,134.

(51) Int. Cl.
*H01L 21/332* (2006.01)
*H01L 21/768* (2006.01)
*H01L 25/10* (2006.01)
*H01L 23/00* (2006.01)

(52) U.S. Cl.
CPC ........ *H01L 21/76804* (2013.01); *H01L 24/19* (2013.01); *H01L 24/20* (2013.01); *H01L 24/24* (2013.01); *H01L 25/105* (2013.01); *H01L 2224/32225* (2013.01); *H01L 2224/48091* (2013.01); *H01L 2224/48227* (2013.01)

(58) Field of Classification Search
CPC ............. H01L 2924/181; H01L 23/528; H01L 23/49827; H01L 21/76804; H01L 21/76877

USPC .......................... 438/127, 126, 637, 638, 640
See application file for complete search history.

(56) References Cited

U.S. PATENT DOCUMENTS

| | | | |
|---|---|---|---|
| 6,313,536 B1 | 11/2001 | Yamada | |
| 7,875,552 B2 | 1/2011 | Lee et al. | |
| 7,928,534 B2 | 4/2011 | Hsu et al. | |
| 7,956,442 B2 | 6/2011 | Hsu et al. | |
| 8,623,753 B1 | 1/2014 | Yoshida et al. | |
| 8,754,514 B2 | 6/2014 | Yu et al. | |
| 8,835,228 B2 | 9/2014 | Mohammed | |
| 8,836,136 B2 | 9/2014 | Chau et al. | |
| 8,878,353 B2 | 11/2014 | Haba et al. | |

(Continued)

FOREIGN PATENT DOCUMENTS

| | | |
|---|---|---|
| CN | 1204154 A | 1/1999 |
| CN | 101719484 A | 6/2010 |

(Continued)

OTHER PUBLICATIONS

"Chapter 1: Introduction 1-12: Schematics and Layout Tutorial 1-12-3: Layout," Electric VLSI Design System User's Manual, printed Mar. 14, 2016, 4 pages.

*Primary Examiner* — S. V. Clark
(74) *Attorney, Agent, or Firm* — Slater Matsil, LLP

(57) ABSTRACT

A package includes a device die, a molding material molding the device die therein, a through-via substantially penetrating through the molding material, wherein the through-via has an end. The end of the through-via is tapered and has rounded sidewall surfaces. The package further includes a redistribution line electrically coupled to the through-via.

20 Claims, 19 Drawing Sheets

(56) References Cited

U.S. PATENT DOCUMENTS

| | | | |
|---|---|---|---|
| 8,901,701 B2* | 12/2014 | Lin .................... | H01L 21/76898 |
| | | | 257/522 |
| 8,903,210 B2* | 12/2014 | Ellis-Monaghan .. | G02B 6/4214 |
| | | | 385/32 |
| 9,029,962 B1 | 5/2015 | Dreiza et al. | |
| 2005/0012218 A1* | 1/2005 | Kuan ................ | H01L 21/76804 |
| | | | 257/758 |
| 2007/0173057 A1* | 7/2007 | Lee .................... | H01L 21/31111 |
| | | | 438/640 |
| 2008/0122102 A1 | 5/2008 | Sakata et al. | |
| 2011/0027962 A1 | 2/2011 | Bernstein et al. | |
| 2013/0037950 A1 | 2/2013 | Yu et al. | |
| 2013/0069224 A1 | 3/2013 | Kim et al. | |
| 2013/0069239 A1 | 3/2013 | Kim et al. | |
| 2013/0075924 A1 | 3/2013 | Lin et al. | |
| 2013/0241057 A1 | 9/2013 | Yu et al. | |
| 2013/0241080 A1 | 9/2013 | Pagaila | |
| 2013/0249106 A1 | 9/2013 | Lin et al. | |
| 2014/0027929 A1 | 1/2014 | Lin et al. | |
| 2014/0061880 A1 | 3/2014 | Liao | |
| 2014/0124901 A1 | 5/2014 | Lee et al. | |
| 2015/0123272 A1 | 5/2015 | Wu | |
| 2016/0104672 A1* | 4/2016 | Augur ................ | H01L 21/76804 |
| | | | 257/774 |
| 2017/0084696 A1* | 3/2017 | Lee .................... | H01L 27/11582 |

FOREIGN PATENT DOCUMENTS

| | | |
|---|---|---|
| CN | 101719488 A | 6/2010 |
| CN | 102931173 A | 2/2013 |
| KR | 1020100065151 A | 6/2010 |
| KR | 1020130018090 A | 2/2013 |
| WO | 2009017835 A2 | 2/2009 |

* cited by examiner

PACKAGES WITH THROUGH-VIAS HAVING TAPERED ENDS

PRIORITY CLAIM AND CROSS-REFERENCE

This application is a divisional of U.S. patent application Ser. No. 14/206,248, entitled "Packages with Through-Vias Having Tapered Ends," filed on Mar. 12, 2014, which application is incorporated herein by reference.

BACKGROUND

In the packaging of integrated circuits, there are various types of packaging methods and structures. For example, in a conventional Package-on-Package (POP) process, a top package is bonded to a bottom package. The top package and the bottom package may also have device dies packaged therein. By adopting the PoP process, the integration level of the packages is increased.

In an existing PoP process, the bottom package is formed first, which includes a device die bonded to a package substrate. A molding compound is molded on the package substrate, wherein the device die is molded in the molding compound. The package substrate further includes solder balls formed thereon, wherein the solder balls and the device die are on a same side of the package substrate. The solder balls are used for connecting the top package to the bottom package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
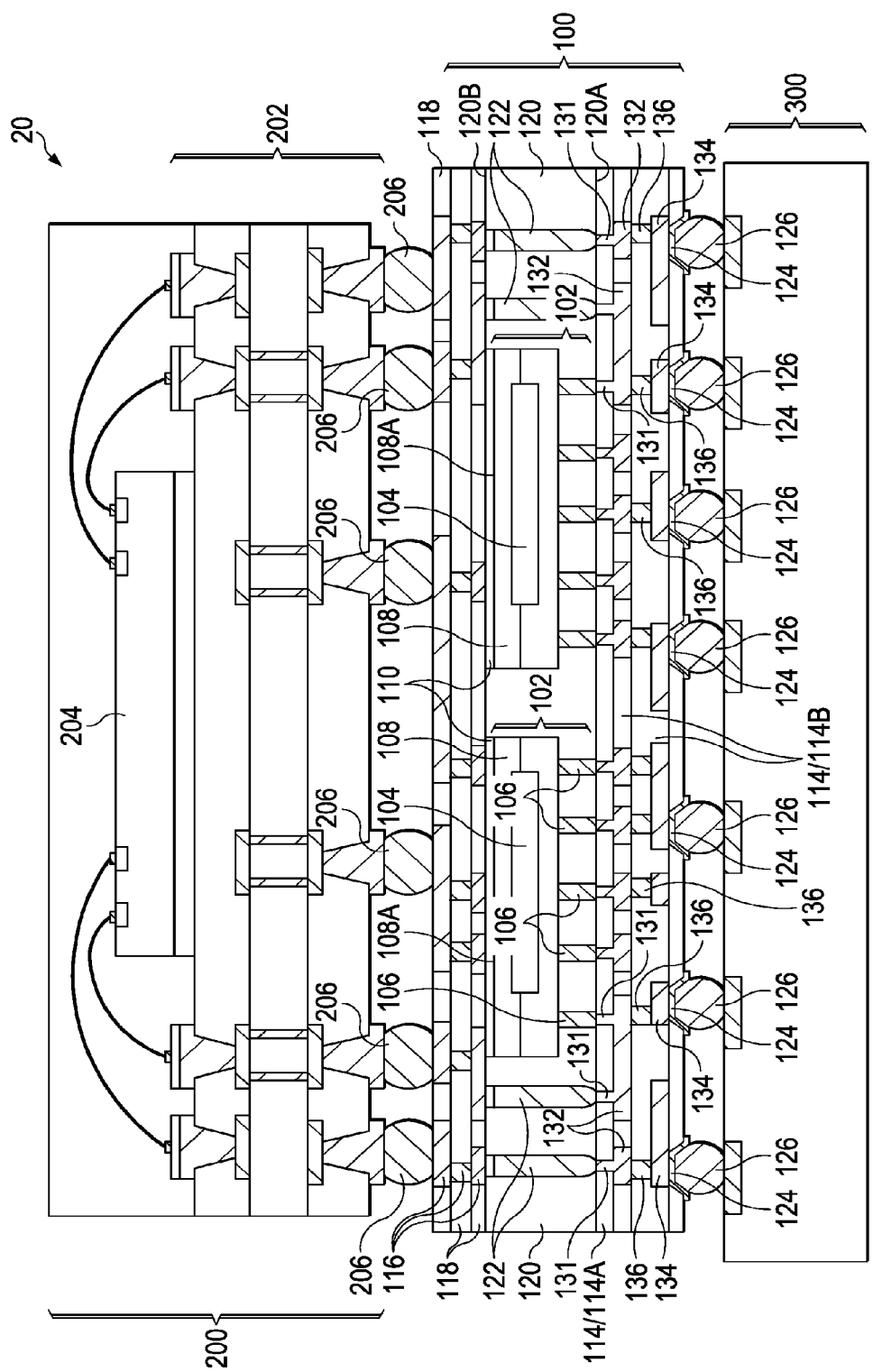
FIG. 1 illustrates a cross-sectional view of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the package are provided in accordance with various exemplary embodiments. The variations of the embodiments are discussed. Throughout the various views and illustrative embodiments, like reference numbers are used to designate like elements.

FIG. 1 illustrates a cross-sectional view of package 20 in accordance with some embodiments. Package 20 includes package 100 and package 200 over and bonded to package 100. In some embodiments, package 100 includes device dies 102, with the front sides of device dies 102 facing down and bonded to Redistribution Lines (RDLs) 132/134/136. In alternative embodiments, package 100 includes a single device die or more than two device dies. Device die 102 may include semiconductor substrate 108, and integrated circuit devices 104 (such as active devices, which include transistors, for example) at the front surface (the surface facing down) of semiconductor substrate 108. Device die 102 may include a logic die such as a Central Processing Unit (CPU) die, a Graphic Processing Unit (GPU) die, a mobile application die, or the like.

Device dies 102 are molded in molding material 120, which surrounds each of device dies 102. Molding material 120 may be a molding compound, a molding underfill, a resin, or the like. Surface 120A of molding material 120 may be level with the bottom ends of device dies 102. Surface 120B of molding material 120 may be level with or higher than back surface 108A of semiconductor substrate 108. In some embodiments, back surface 108A of semiconductor substrate 108 is in contact with die-attach film 110, which is a dielectric film adhering device die 102 to the overlying dielectric layer 118. Device die 102 further includes metal pillars/pads 106 (which may include copper pillars, for example) electrically coupled to RDLs 132.

Package 100 may include bottom-side RDLs 132/134/136 underlying device dies 102, and top-side RDLs 116 overlying device dies 102. Bottom-side RDLs 132/134/136 are formed in dielectric layers 114, and top-side RDLs 116 are formed in dielectric layers 118. RDLs 132/134/136 and 116 may be formed of copper, aluminum, nickel, titanium, alloys thereof, or multi-layers thereof. In some embodiments, dielectric layers 114 and 118 are formed of organic materials such as polymers, which may further include polybenzoxazole (PBO), benzocyclobutene (BCB), polyimide, or the like. In alternative embodiments, dielectric layers 114 and 118 are formed of inorganic material such as silicon oxide, silicon nitride, silicon oxynitride, or the like.

Through-Vias 122 are formed in, and may substantially penetrate through, molding material 120. In some embodiments, through-vias 122 have first surfaces (the top surfaces in FIG. 1) level with the surface 120B of molding material 120, and second surfaces (the bottom surfaces in FIG. 1) substantially level with the surface 120A of molding material 120. Through-Vias 122 electrically couple bottom-side RDLs 132/134/136 to top-side RDLs 116. Through-Vias 122 may also be in physical contact with vias 131 and top-side RDLs 116. In some embodiments, the bottom ends of through-vias 122 are tapered and/or curved, with the bottom cross-sectional area smaller than the cross-sectional areas of the overlying portions.

UBMs 124, which are formed of a non-solder metallic material(s), are formed close to the bottom surface of package 100. UBMs 124 may include copper, aluminum, titanium, nickel, palladium, gold, or multi-layers thereof. In some embodiments, the bottom surfaces of UBMs 124 extend below the bottom surface of the bottom dielectric layer 114, as shown in FIG. 1. Solder regions 126 may be attached to the bottom surfaces of UBMs 124.

In some embodiments, RDLs 132/134/136 include portions (including 132 and 134) in more than one metal layers, and vias 136 interconnecting the RDLs in different metal layers. For example, FIG. 1 illustrates RDLs 132, which are closest to through-vias 122. The bottom surfaces of through-vias 122 are in contact with vias 131. Furthermore, metal pillars 106 of device die 102 are also in contact with vias 131. UBMs 124 are electrically coupled to, and may be in physical contact with, RDLs 134. Hence, RDLs 134 may be in the metal layer that is closest to UBMs 124. Vias 136 are disposed between, and electrically interconnect, RDLs 132 and RDLs 134.

Figure 20:
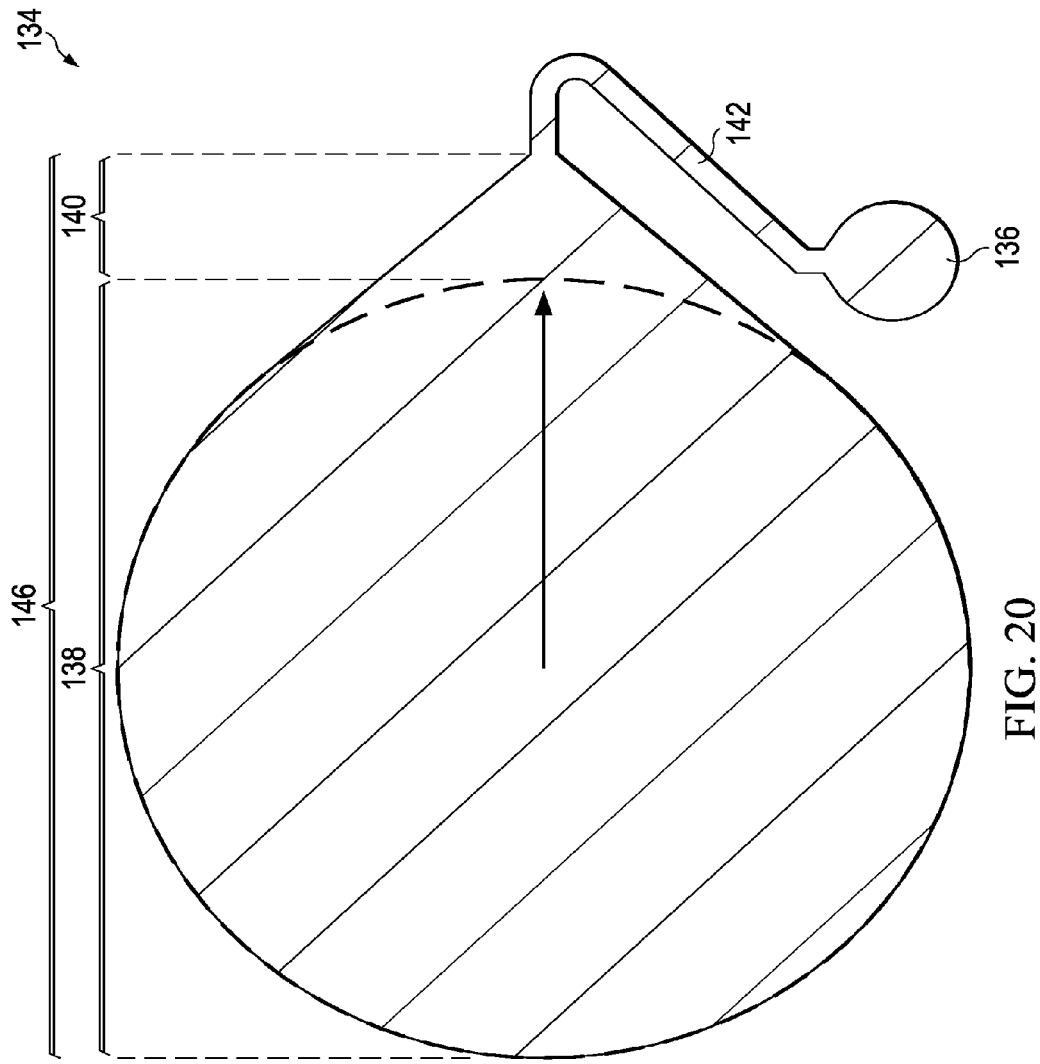
FIG. 20 illustrates a bottom view of a Redistribution Line (RDL) pad in accordance with some embodiments, wherein the RDL pad includes a main pad region and a bird-beak region connected to the main pad region.

FIG. 20 illustrates a bottom view of one of RDLs 134. The illustrated RDL 134 includes main pad region 138, metal trace 142, and bird-beak region 140 connecting main pad region 138 to metal trace 142. In accordance with some embodiments, main pad region 138 has a round bottom-view shape. In alternative embodiments, main pad region 138 may have other applicable shapes including, and not limited to, rectangles, hexagons, octagons, and the like. Bird-beak region 140 is the region that has widths gradually and/or continuously transitioning from the width of main pad region 138 to the width of metal trace 142. Metal trace 142 has one end connected to one of vias 136, which leads to RDLs 132 (FIG. 1).

Figure 2:
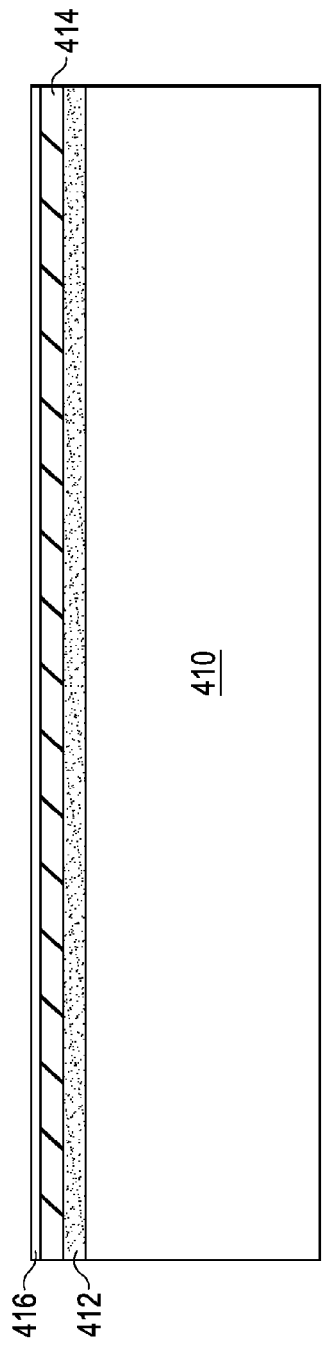
FIGS. 2 through 19 illustrate the cross-sectional views of intermediate stages in the formation of a package in accordance with some embodiments.
Figure 3:
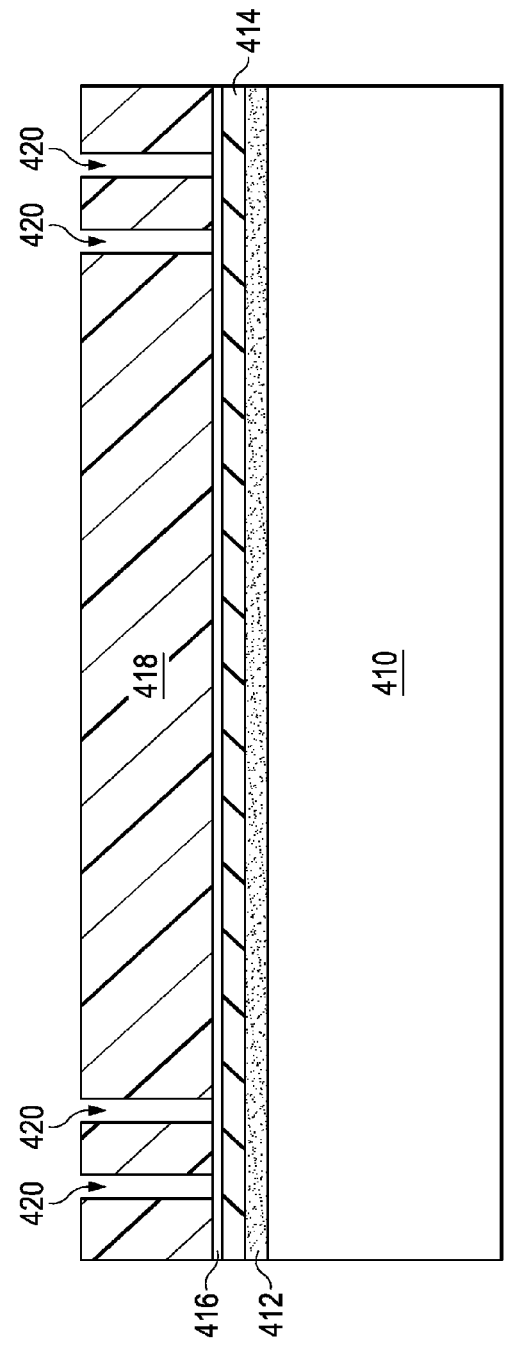

FIGS. 2 through 19 illustrate the cross-sectional views of intermediate stages in the formation of package 100 in accordance with some exemplary embodiments. Referring to FIG. 2, carrier 410 is provided, and adhesive layer 412 is disposed on carrier 410. Carrier 410 may be a blank glass carrier, a blank ceramic carrier, or the like. Adhesive layer 412 may be formed of an adhesive such as a Ultra-Violet (UV) glue, a Light-to-Heat Conversion (LTHC) glue, or the like, although other types of adhesives may be used.

Buffer layer 414 is formed over adhesive layer 412. Buffer layer 414 is a dielectric layer, which may be a polymer layer comprising a polymer. The polymer may be, for example, polyimide, PBO, BCB, Ajinomoto Buildup Film (ABF), Solder Resist film (SR), or the like. Buffer layer 414 is a planar layer having a uniform thickness, which may be greater than about 2 µm, and may be between about 2 µm and about 40 µm. The top and the bottom surfaces of buffer layer 414 are also planar. In alternative embodiments, buffer layer 414 is not formed.

Seed layer 416 is formed over buffer layer 414, for example, through Physical Vapor Deposition (PVD) or metal foil lamination. Seed layer 416 may comprise copper, aluminum, titanium, or multi-layers thereof. In some embodiments, seed layer 416 comprises a titanium layer (not shown) and a copper layer (not shown) over the titanium layer. In alternative embodiments, seed layer 416 is a single copper layer.

Figure 4:
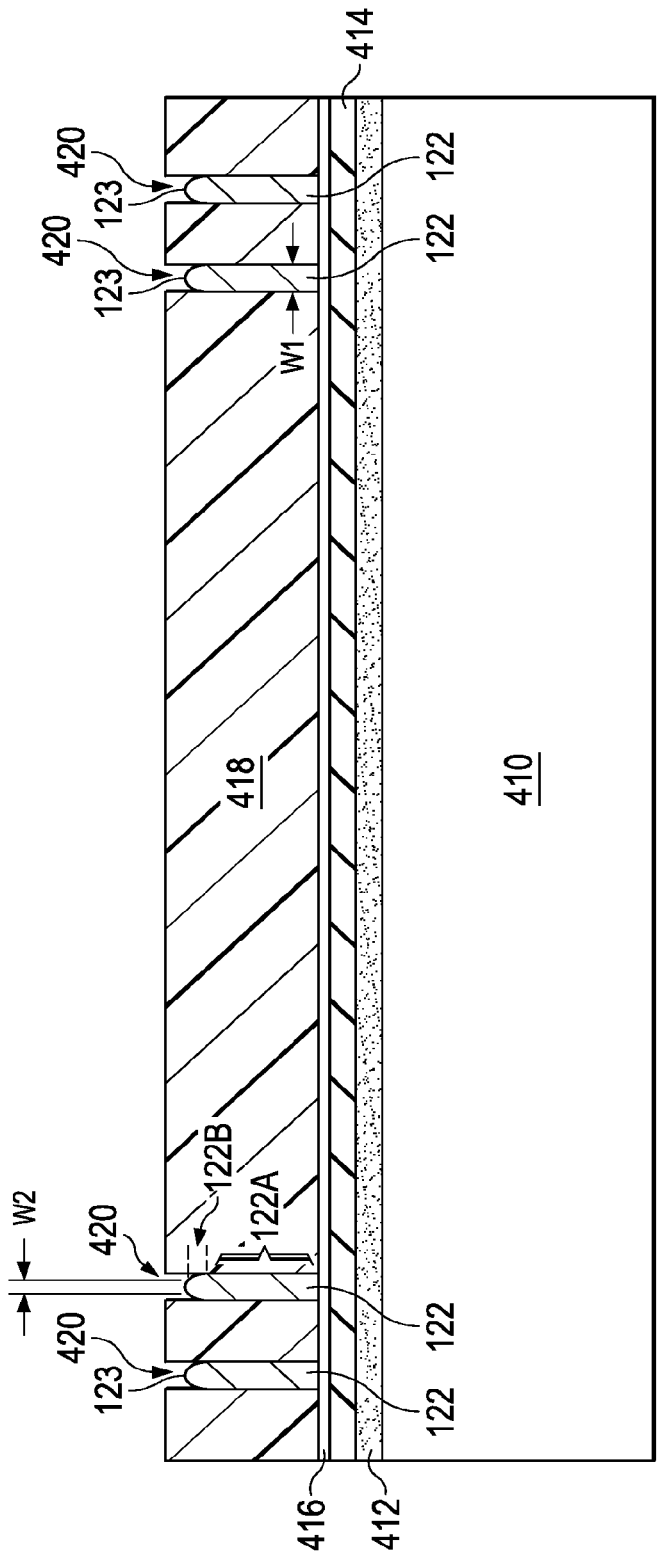

Referring to FIG. 4, photo resist 418 is applied over seed layer 416, and is then patterned. As a result, openings 420 are formed in photo resist 418, through which some portions of seed layer 416 are exposed.

As shown in FIG. 4, through-vias 122 are formed in photo resist 418 through plating, which may be electro plating or electro-less plating. Through-vias 122 are plated on the exposed portions of seed layer 416. Through-vias 122 may comprise copper, aluminum, tungsten, nickel, or alloys thereof. Accordingly, through-vias 122 are alternatively referred to as metal through-vias or conductive through-vias. The top-view shapes of through-vias 122 may be rectangles, squares, circles, or the like. The heights of through-vias 122 are determined by the thickness of the subsequently placed dies 102 (FIG. 1), with the heights of through-vias 122 greater than, equal to, or smaller than the thickness of dies 102 in various embodiments.

In some embodiments, the process conditions for forming through-vias 122 are adjusted, so that through-vias 122 have tapered, and possibly rounded, top ends. For example, the lower portions 122A of through-vias 122 have sidewalls contacting photo resist 418, and these portions of through-vias 122 have width W1 (which may be a diameter). Lower portions 122A have a rod shape with a substantially uniform width W1. In some embodiments, width W1 is in the range between about 100 µm and about 300 µm. Furthermore, lower portions 122A of through-vias 122 have substantially straight and vertical sidewalls. The top portions 122B of through-vias 122 have rounded top surface and rounded sidewall surfaces, wherein the top surface and sidewall surfaces of the top portions 122B are not in contact with photo resist 48. Width W2 (which may be a diameter) of the top portions 122B are smaller than width W1. Furthermore, the portions of top portions 122B closer to the top ends 123 are increasingly narrower than the underlying portions of top portions 122B.

Figure 5:
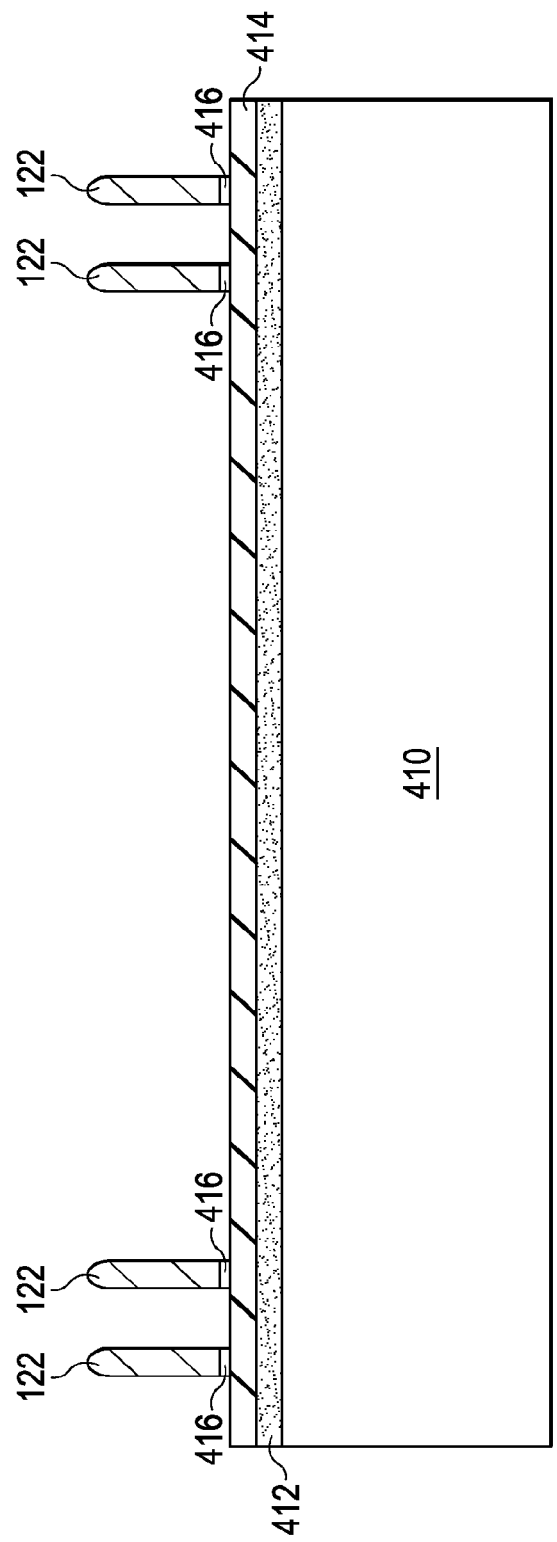

After the plating of through-vias 122, photo resist 418 is removed, and the resulting structure is shown in FIG. 5. In addition, the portions of seed layer 416 that are covered by photo resist 418 are exposed. An etch step is performed to remove the exposed portions of seed layer 416, wherein the etching may be an anisotropic etching. The portions of seed layer 416 that are overlapped by through-vias 122, on the other hand, remain not to be etched. Throughout the description, the remaining underlying portions of seed layer 416 are referred to as the bottom portions of through-vias 122. Although seed layer 416 is shown as having distinguishable interfaces with the overlying portions of through-vias 122, when seed layer 416 is formed of a material similar to or the same as the respective overlying through-vias 122, seed layer 416 may be merged with through-vias 122 with no distinguishable interface therebetween. In alternative embodiments, there exist distinguishable interfaces between seed layer 416 and the overlying plated portions of through-vias 122.

Figure 6:
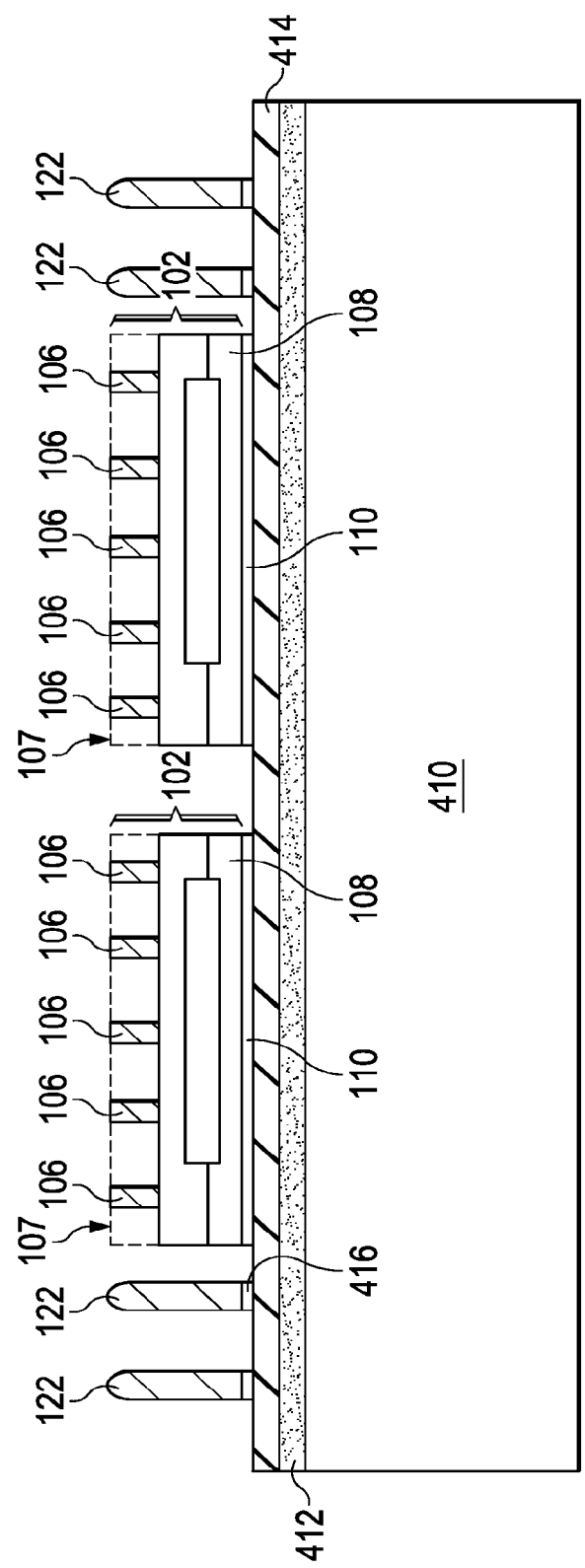

FIG. 6 illustrates the placement of device dies 102 over buffer layer 414. Device dies 102 may be adhered to buffer layer 414 through adhesive layer(s) 110. Device dies 102 may be logic device dies including logic transistors therein. In some exemplary embodiments, device dies 102 are designed for mobile applications, and may be Central Computing Unit (CPU) dies, Power Management Integrated Circuit (PMIC) dies, Transceiver (TRX) dies, or the like. Each of device dies 102 includes semiconductor substrate 108 (a silicon substrate, for example) that contacts adhesive layer 110, wherein the back surface of semiconductor substrate 108 is in contact with adhesive layer 110.

In some exemplary embodiments, metal pillars 106 (such as copper posts) are formed as the top portions of device dies 102, and are electrically coupled to the devices such as transistors (not shown) in device dies 102. In some embodiments, dielectric layer 107 is formed at the top surface of the respective device die 102, with metal pillars 106 having at least lower portions, or an entirety, in dielectric layer 107. The top surfaces of metal pillars 106 may also be level with the top surfaces of dielectric layers 107 in some embodiments. Alternatively, dielectric layers 107 are not formed, and metal pillars 106 protrude above a top dielectric layer of the respective device dies 102.

Figure 7:
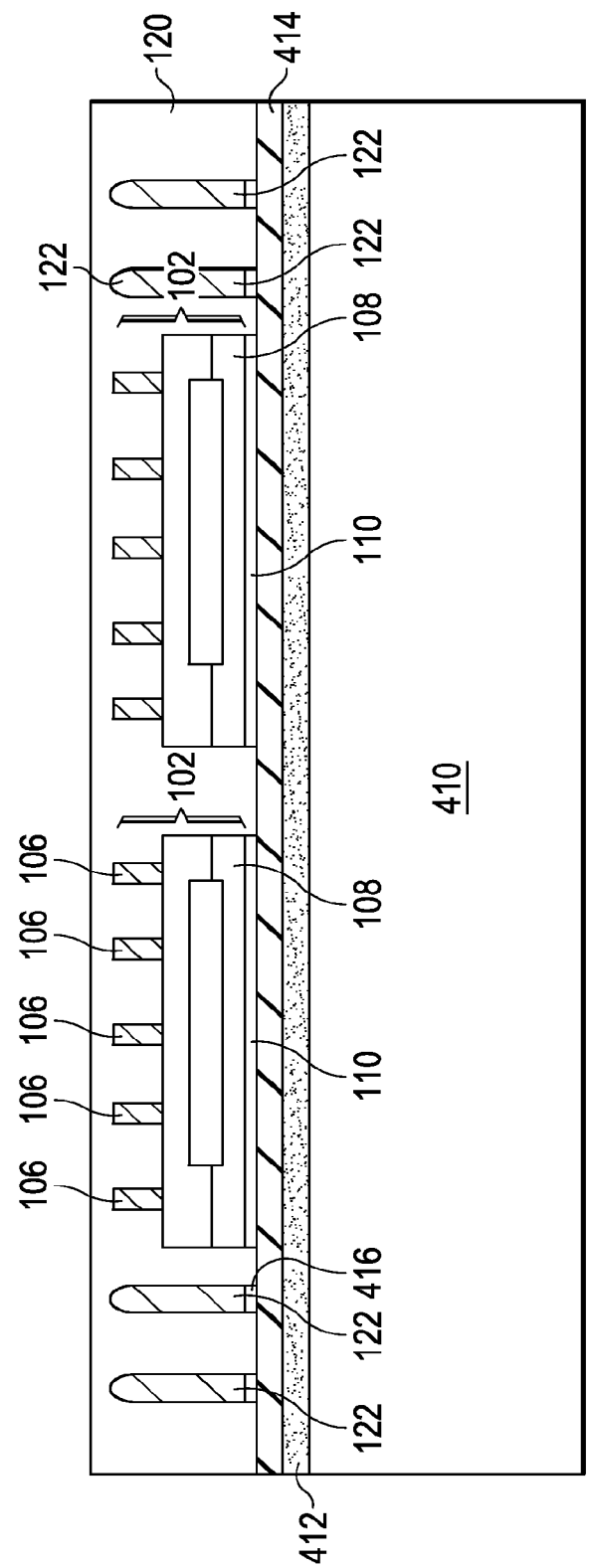

Referring to FIG. 7, molding material 120 is molded on device dies 102 and through-vias 122. Molding material 120 fills the gaps between device dies 102 and through-vias 122, and may be in contact with buffer layer 414. Furthermore, molding material 120 is filled into the gaps between metal pillars 106 when metal pillars 106 are protruding metal pillars. Molding material 120 may include a molding compound, a molding underfill, an epoxy, or a resin. The top surface of molding material 120 is higher than the top ends of metal pillars 106 and through-vias 122.

Figure 8:
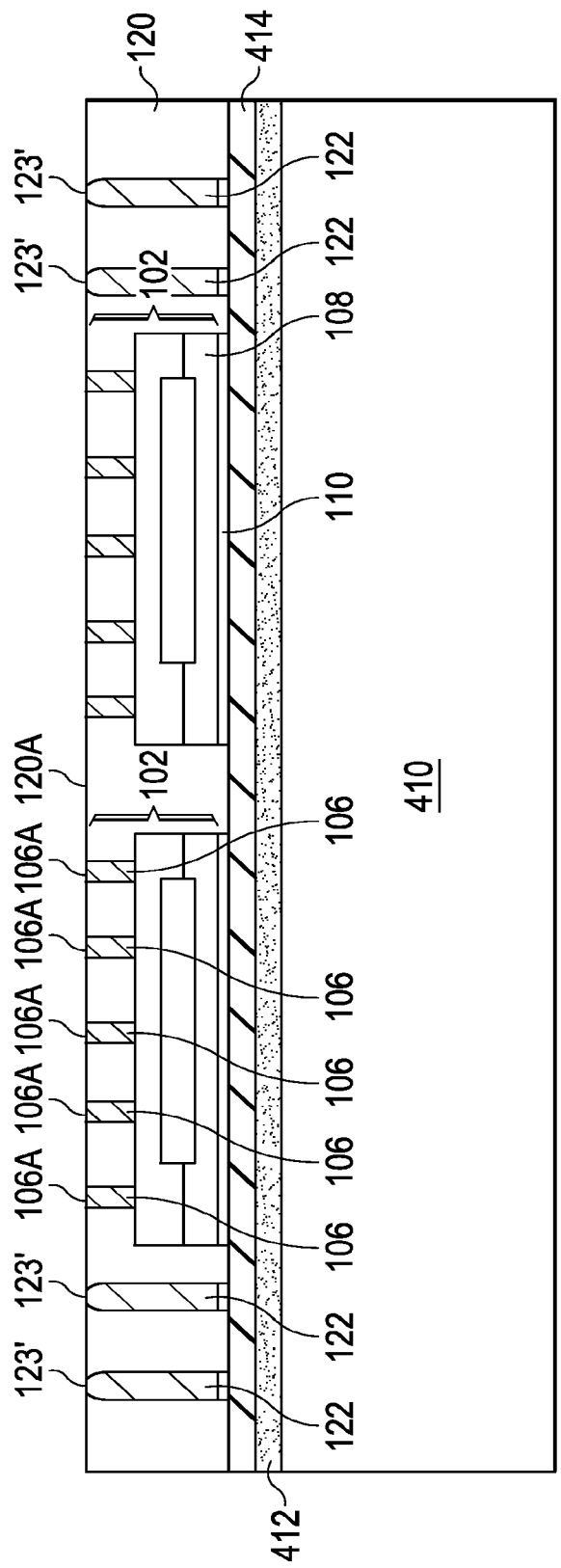
Figure 11:
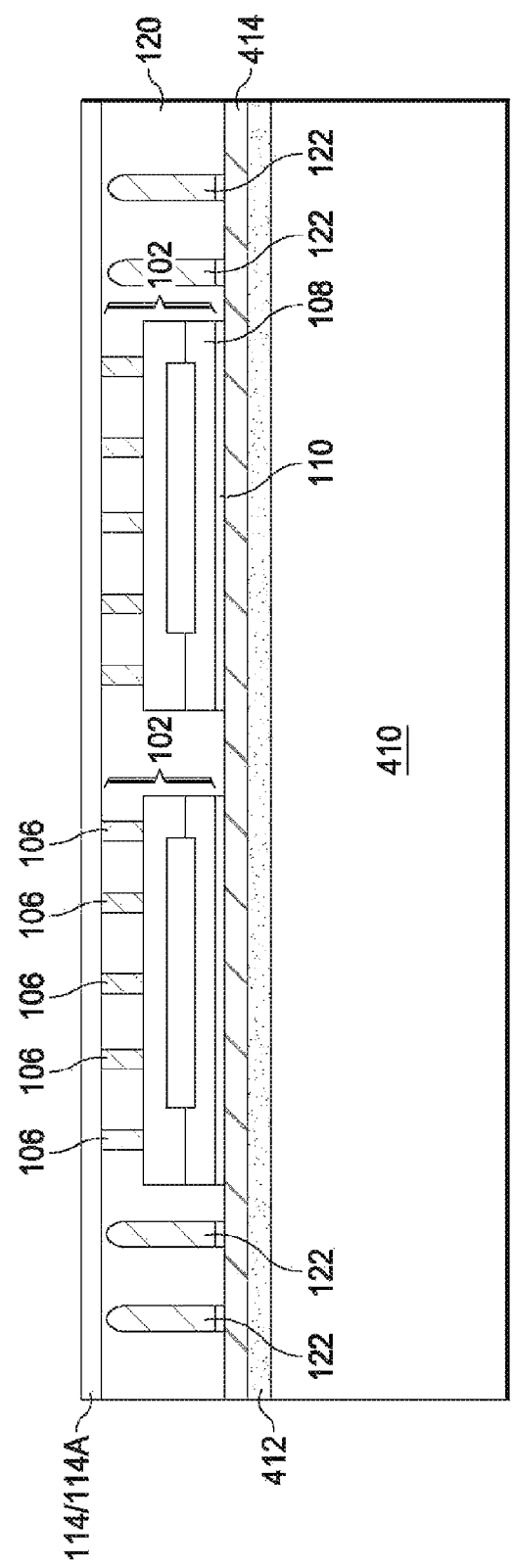

Next, a planarization such as a Chemical Mechanical Polish (CMP) step or a grinding step is performed to thin molding material 120, until through-vias 122 are exposed. In some embodiments, as shown in FIG. 8, through-vias 122 are also exposed as a result of the grinding. In alternative embodiments, as shown in FIG. 11, through-vias 122 remain to be fully embedded in molding material 120 after the grinding, with a surface layer of molding material covering through-vias 122.

Referring again to FIG. 8, due to the grinding, the top ends 123' of through-vias 122 are substantially level (coplanar) with the top ends 106A of metal pillars 106, and are substantially level (coplanar) with top surface 120A of molding material 120. Top ends 123' may be a planar surface.

Figure 9:
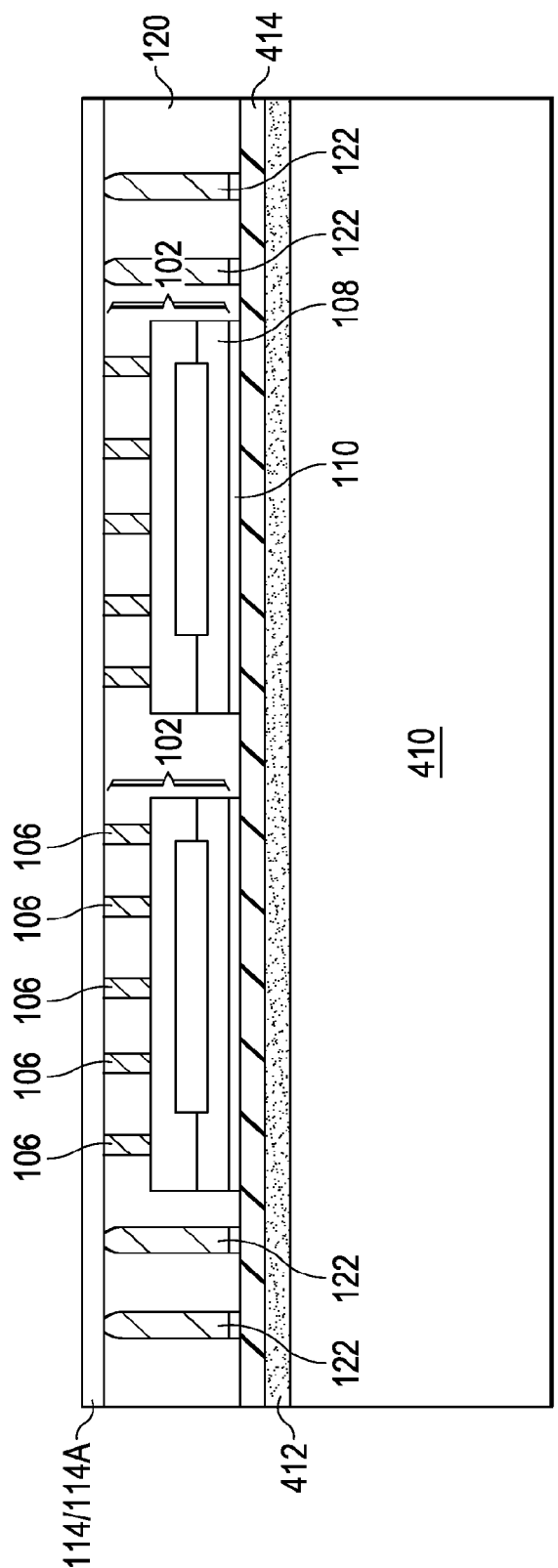

Referring to FIG. 9, dielectric layer 114A is formed. In some embodiments, dielectric layer 114A is formed of a polymer such as PBO, polyimide, or the like. In alternative embodiments, dielectric layer 114A is formed of silicon nitride, silicon oxide, or the like.

Figure 10:
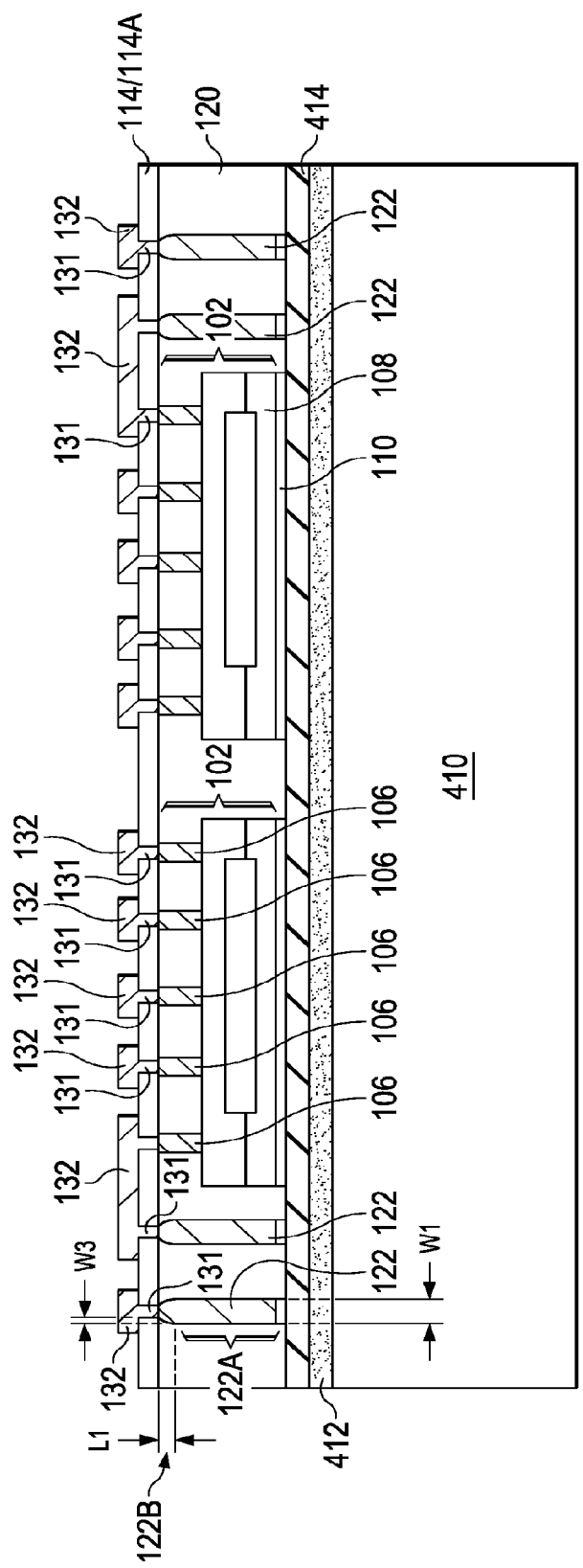

Next, referring to FIG. 10, Redistribution Lines (RDLs) 132 are formed to connect to metal pillars 106 and through-vias 122. RDLs 132 may also interconnect metal pillars 106 and through-vias 122. Vias 131 are formed in dielectric layer 114A to connect to through-vias 132. Vias 131 are alternatively referred to as conductive vias 131. In some embodiments, vias 131 and RDLs 132 are formed in a plating process, wherein each of vias 131 and RDLs 132 includes a seed layer (not shown) and a plated metallic material over the seed layer. The seed layer and the plated material may be formed of a same material or different materials.

In the structure as shown in FIG. 10, the top end portions 122B of through-vias 122 connecting to vias 131 have tapered and/or rounded sidewall surfaces. Vias 131 are in contact with the planar top surfaces of through-vias 122. The lateral dimension measured at the interface between through-vias 122 and vias 131 are reduced (recessed) by distance W3 (on each side) from the substantially vertical sidewall of the lower portions 122A that have width W1 (also refer to FIG. 4). In some embodiments, the recessing distance W3 is greater than about 3.5 μm, and may be in the range between about 3.5 μm and about 15 μm. Furthermore, the rounded (and/or tapered) end portions 122B have a length L1 in the range between about 5 μm and about 20 μm.

Figure 12:
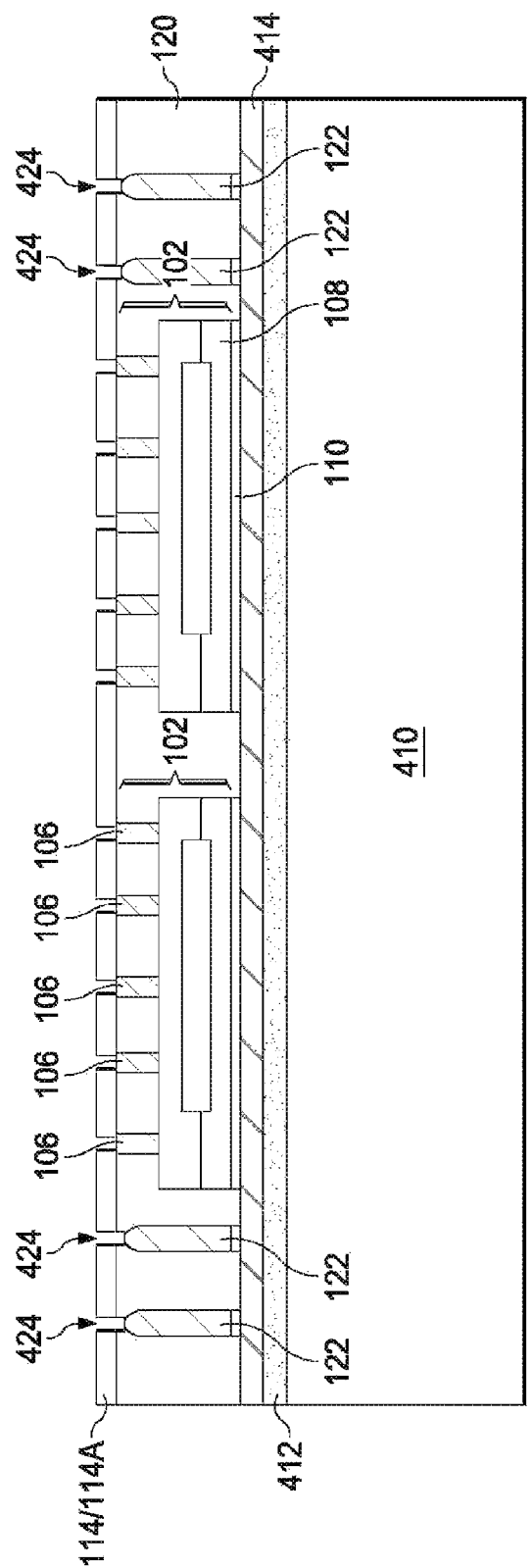
Figure 13:
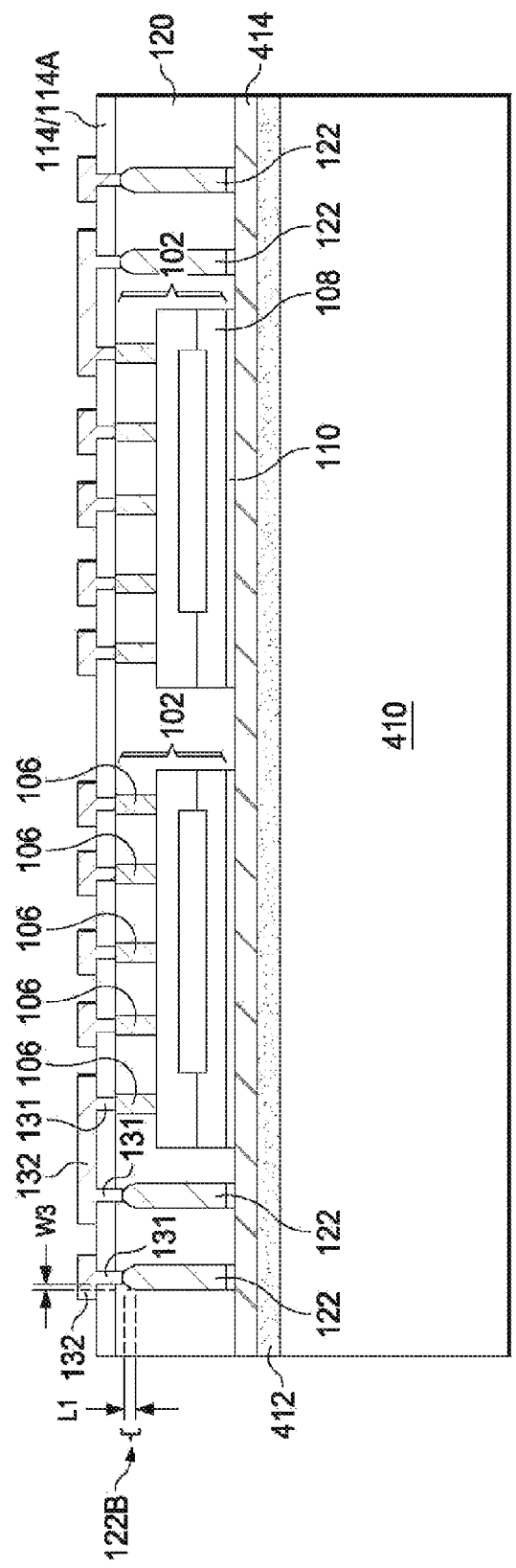

FIGS. 11 through 13 illustrate some alternative embodiments. Unless specified otherwise, the materials and the formation methods of the components in these embodiments are essentially the same as the like components, which are denoted by like reference numerals in the embodiments shown in FIGS. 8 through 10. The details regarding the formation process and the materials of the components shown in FIGS. 11 through 13 may thus be found in the discussion of the embodiment shown in FIGS. 8 through 10. The initial steps of these embodiments are essentially the same as shown in FIGS. 1 through 7.

FIG. 11 illustrates the cross-sectional view of the structure after the grinding of molding material 120. In these embodiments, after the grinding, metal pillars 106 are exposed, while through-vias 122 are not exposed. Next, as shown in FIG. 12, dielectric layer 114A is formed over molding material 120. A patterning step is then performed to etch portions of dielectric layer 114A and molding material 120, so that openings 424 are formed. Through-vias 122 are exposed through openings 424. Next, as shown in FIG. 13, RDLs 132 and vias 131 are formed, for example, through a plating process.

In the structure shown in FIG. 13, vias 131 extend into dielectric layer 114A and molding material 120. The top ends of through-vias 122 are lower than the top ends of metal pillars 106. Furthermore, vias 131 are in contact with the round top surfaces (as shown in detail in FIG. 6) of through-vias 122, with the interface also being rounded. Since the material on the opposite sides (with one side being via 131 and the other side being through-via 122) may be formed of different materials, the interface may be distinguishable, for example, when viewed using X-ray imaging. In addition, the end portions of through-vias 122 are also recessed laterally with recessing distance W3, wherein the recessing occurs in the length L1. The values of recessing distance W3 and length L2 are discussed referring to the structure shown in FIG. 10. The portions of vias 131 in molding material 120 have sidewalls contacting molding material 120.

Figure 14:
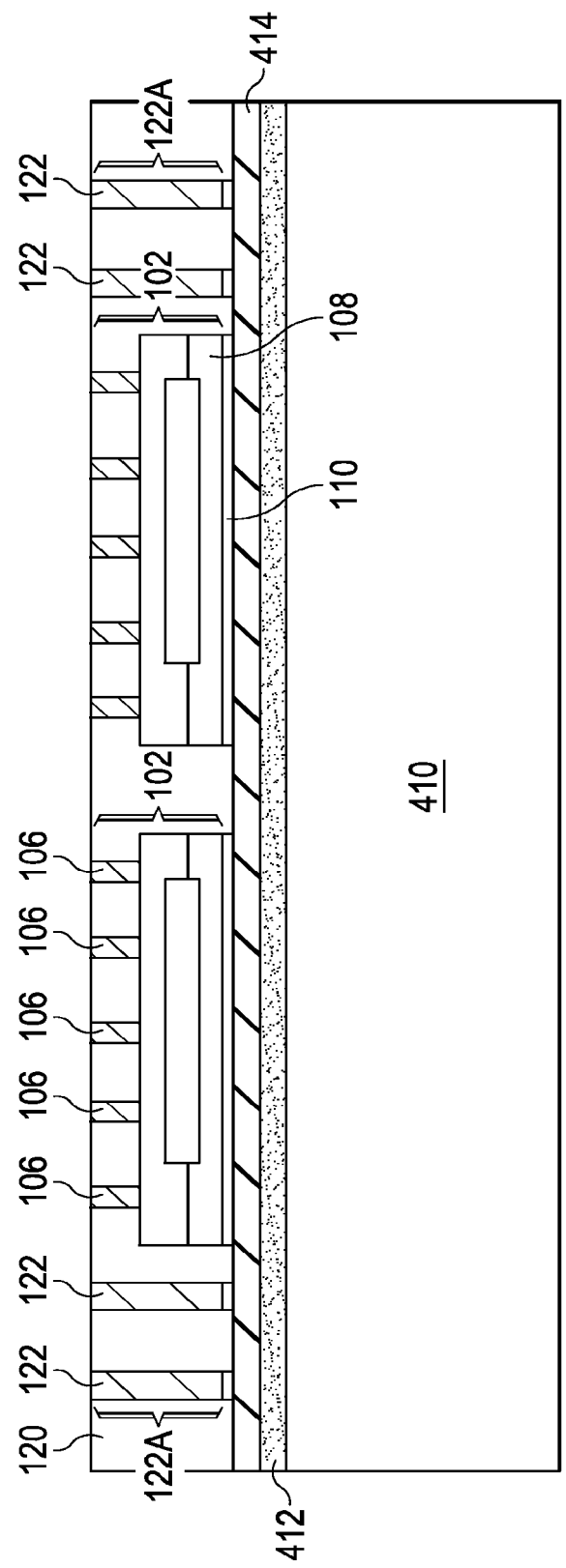
Figure 15:
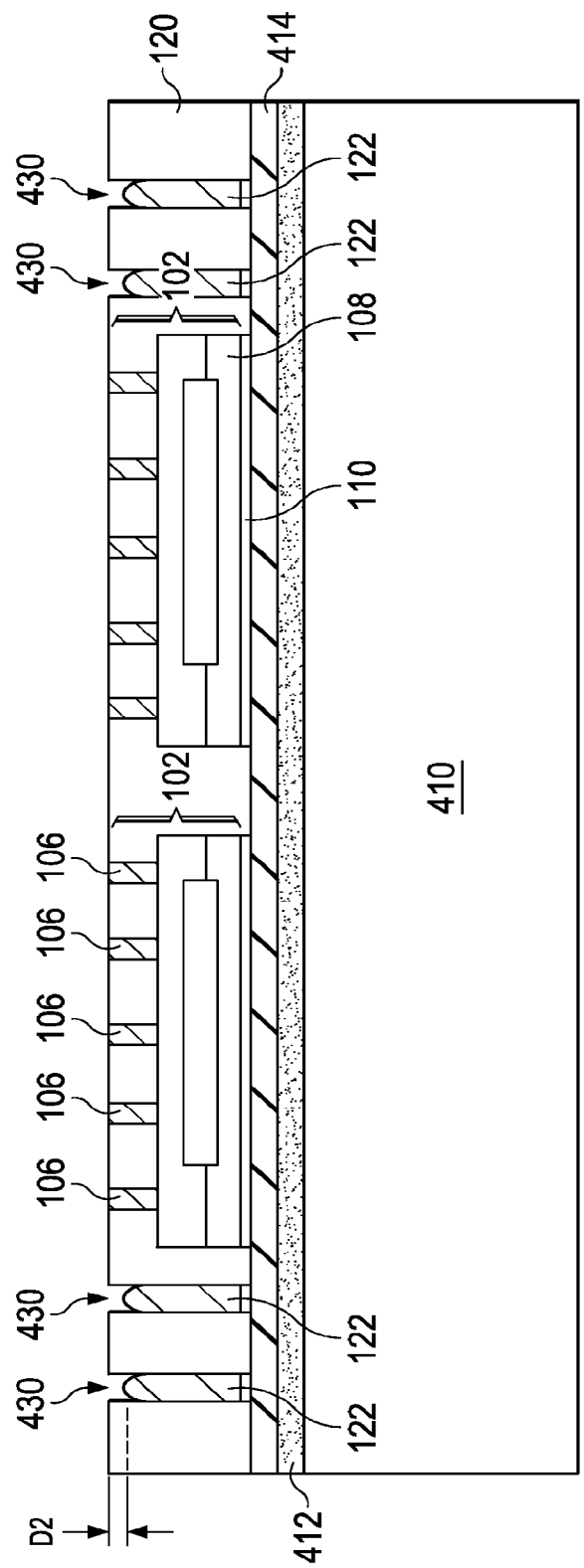
Figure 16:
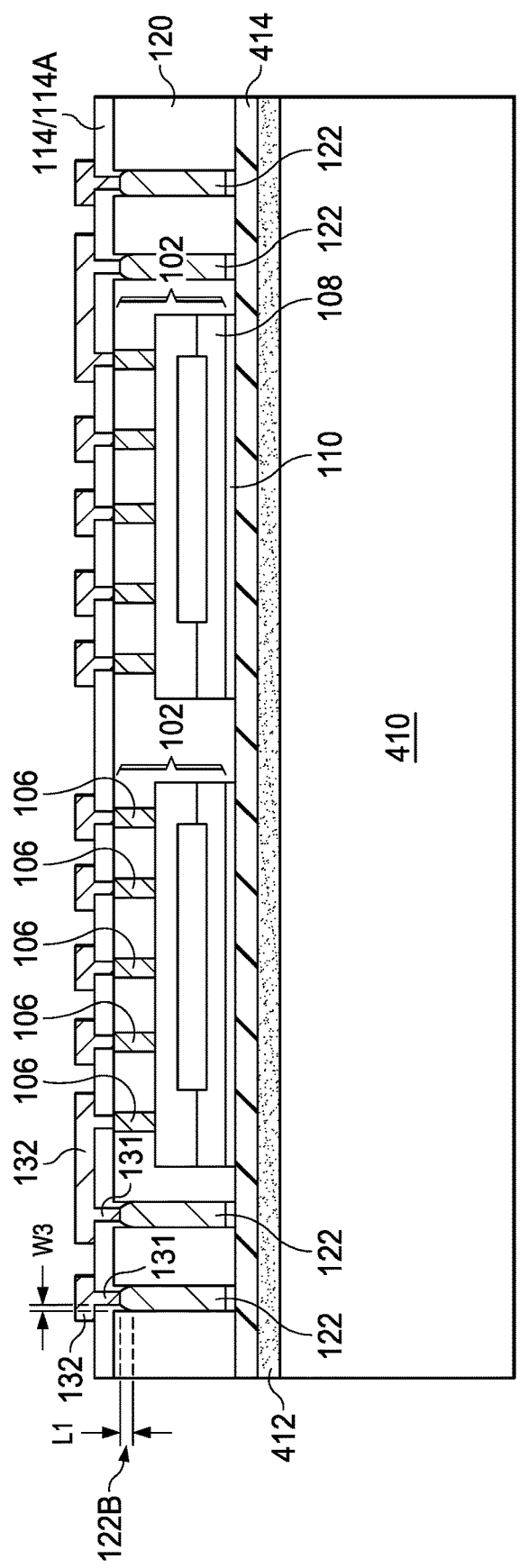

FIGS. 14 through 16 illustrate some alternative embodiments. Some of the details regarding the formation process and the materials of the components shown in FIGS. 14 through 16 may thus be found in the discussion of the embodiments shown in FIGS. 8 through 13. The initial steps of these embodiments are essentially the same as shown in FIGS. 1 through 7.

FIG. 14 illustrates the cross-sectional view of the structure after the grinding of molding material 120. In these embodiments, after the grinding, both through-vias 122 and metal pillars 106 are exposed. In addition, the tapered end portions 122B as shown in FIG. 4 are also removed by the grinding, leaving bottom portions 122A. The remaining portions of through-vias 122 have substantially vertical edges.

FIG. 15 illustrates an etching process to etch through-vias 122. It is appreciated that although metal pillars 106 are also etched and recessed, and may have similar top surface shapes as through-vias 122, the details of metal pillars 106 are not illustrated in detail. The etching may be performed using wet etching, for example, using an HF-based solution as an etchant. As a result of the etching, recesses 430 are formed in molding material 120. The top end portions of through-vias 122 are rounded, and may have the similar rounded shapes as shown in FIG. 13. Furthermore, the top ends of through-vias 122 are recessed below that of molding material 120. In some exemplary embodiments, the recessing depth D2 is greater than about 3 μm.

FIG. 16 illustrates the formation of dielectric layer 114A and vias 131. In the structure shown in FIG. 16, dielectric layer 114A and vias 131 extend into molding material 120, wherein the bottom surfaces of dielectric layer 114A and vias 131 are in contact with the rounded top surfaces of through-vias 122. The top ends of through-vias 122 are lower than the top surface of molding material 120. Furthermore, vias 131 are in contact with the rounded top surfaces of through-vias 122, with the interface also being rounded. Since the material on the opposite sides (with one side being via 131 and the other side being through-via 122) may be formed of different material, the interface may be distinguishable, for example, when viewed using X-ray imaging. In addition, the end portions of through-vias 122 are also recessed laterally with recessing distance W3, wherein the recessing occurs in the length L1. The values of recessing distance W3 and length L2 are discussed referring to the structure shown in FIG. 10.

Figure 17:
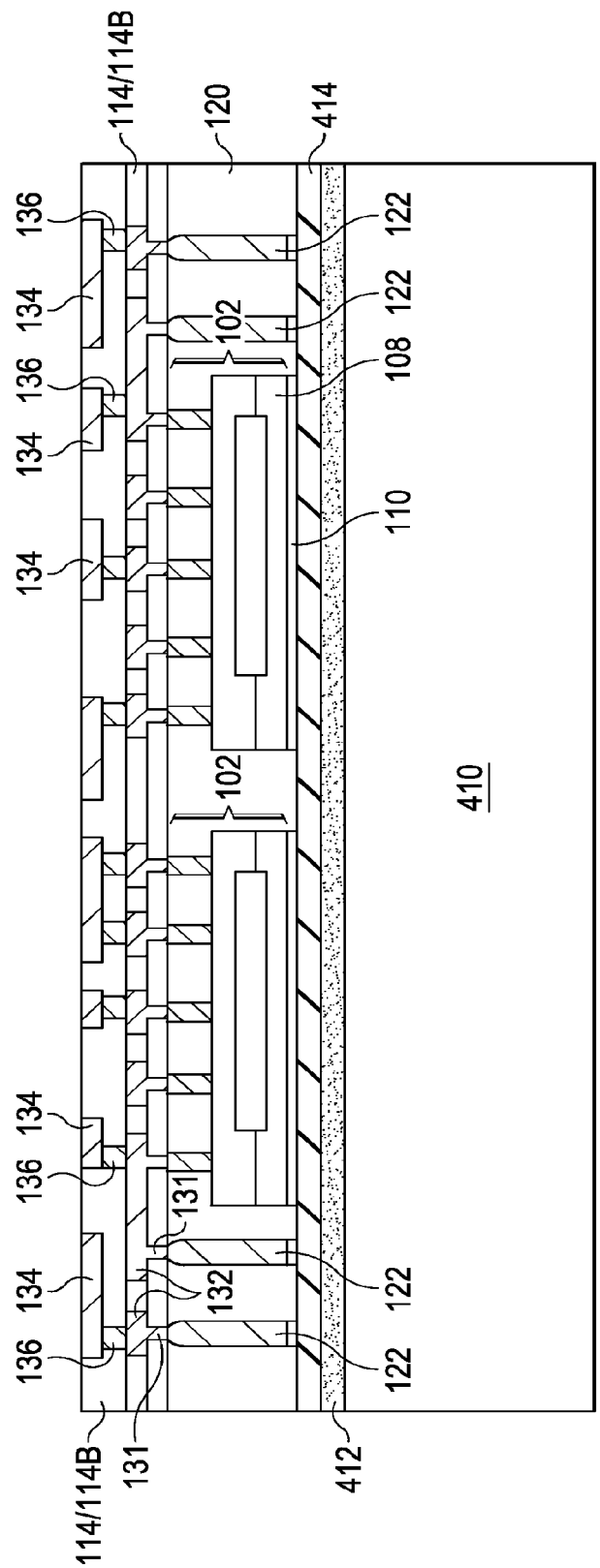

Manufacturing processes are then continued from the structure shown in FIG. 10, 13, or 16. The subsequent drawings 17 through 19 illustrate the structure formed starting from the structure in FIG. 10. One skilled in the art, however, equipped with the teaching provided in the embodiments of the present disclosure, will realize the formation process when the structure in FIG. 13 or FIG. 16 is used. Referring to FIG. 17, in accordance with various embodiments, one or a plurality of dielectric layers 114 (marked as 114B) are formed over the structure shown in FIG. 10, 13, or 16, with RDLs 134 formed in dielectric layers 114. In some embodiments, the formation of each layer of RDLs 134 includes forming a blanket copper seed layer, forming and patterning a mask layer over the blanket copper seed layer, performing a plating to form RDLs 134, removing the mask layer, and performing flash etching to remove the portions of the blanket copper seed layer not covered by RDLs 134. RDLs 134 may comprise a metal or a metal alloy including aluminum, copper, tungsten, and/or alloys thereof. FIG. 17 illustrates one RDL layer 134, while there may be more than one layer of RDLs 134, depending on the routing requirement of the respective package. Dielectric layers 114B in these embodiments may comprise polymers such as polyimide, BCB, polybenzoxazole PBO, or the like. Alternatively, dielectric layers 114B may include non-organic dielectric materials such as silicon oxide, silicon nitride, silicon carbide, silicon oxynitride, or the like.

Figure 18:
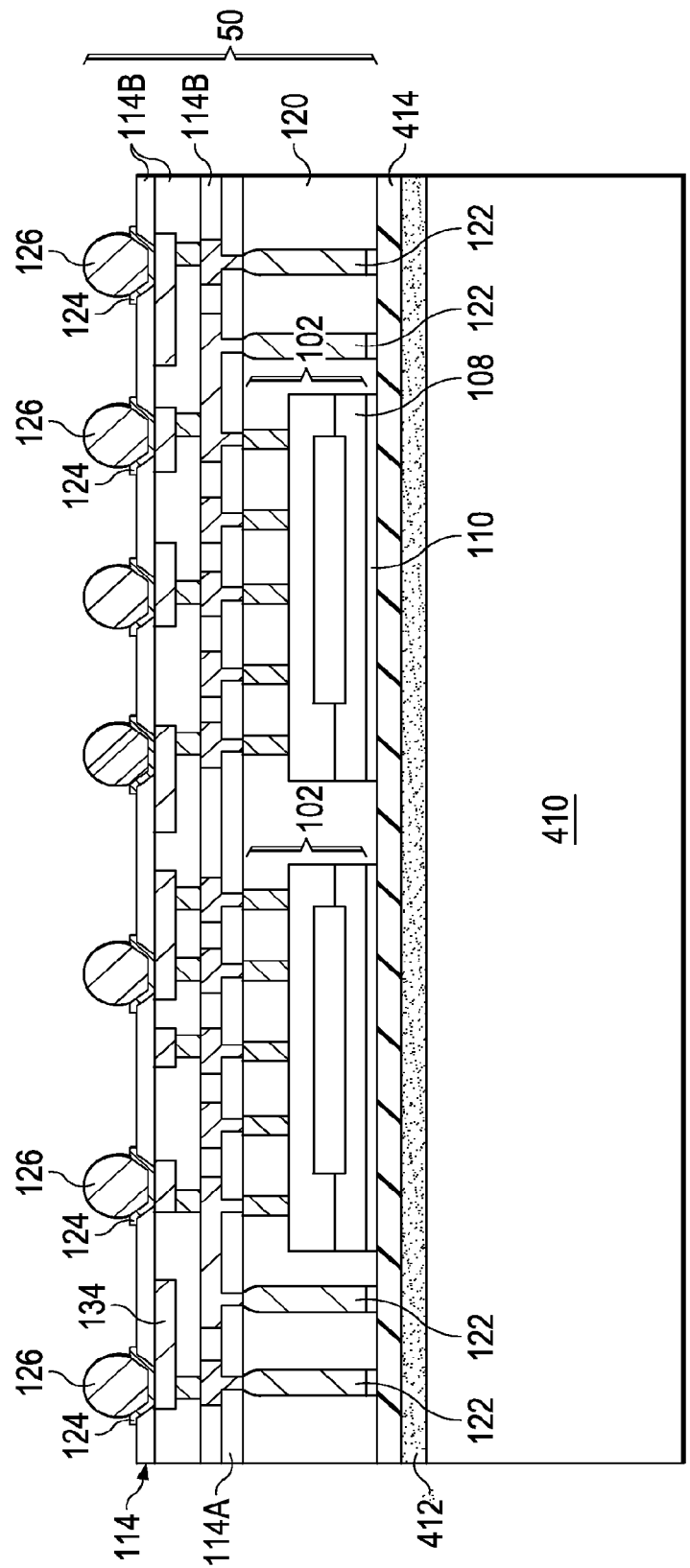

FIG. 18 illustrates the formation of UBMs 124 and electrical connectors 126 in accordance with some exemplary embodiments. The formation of electrical connectors 126 may include placing solder balls on the exposed portions of UBMs 124, and then reflowing the solder balls. In alternative embodiments, the formation of electrical connectors 126 includes performing a plating step to form solder regions over RDLs 134, and then reflowing the solder regions. Electrical connectors 126 may also include metal pillars, or metal pillars and solder caps, which may also be formed through plating. Throughout the description, the combined structure including device dies 102, through-vias 122, molding material 120, the overlying RDLs 132/134/136, and dielectric layers 114A and 114B is referred to as package 50, which may be a composite wafer.

Figure 19:
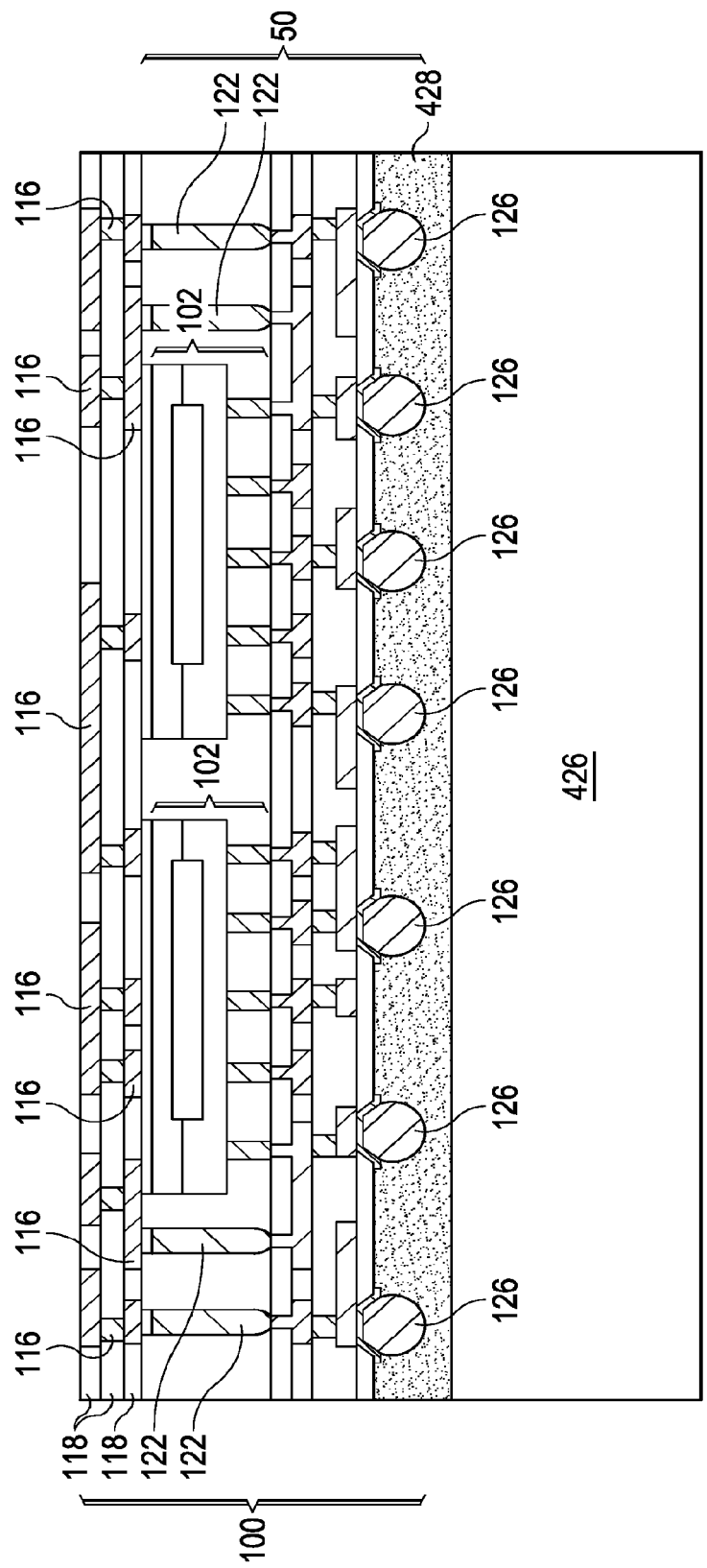

Next, package 50 is de-bonded from carrier 410. Adhesive layer 412 and buffer layer 414 (if any) are also cleaned from package 50. The resulting structure is shown in FIG. 19. Package 50 is further adhered to carrier 426 through adhesive 428, wherein electrical connectors 126 face toward, and may contact, adhesive 428. Dielectric layers 118 and RDLs 116 are then formed to finish the formation of package 100. Package 100 may then be bonded to package components 200 and/or 300, and the resulting structure is shown in FIG. 1.

The embodiments of the present disclosure have some advantageous features. By forming tapered or rounded end portions for through-vias, the stress applied to RDLs by the through-vias is reduced. For example, in the conventional structures that the through-vias do not have tapered end portions, RDL traces 142 as shown in FIG. 20 may be broken, which may be resulted since the dielectric layers 114 (FIG. 1) are broken due to the stress. With the end portions of the through-vias being rounded or tapered, the breakage of the RDLs is reduced, and the reliability of the resulting package is improved.

In accordance with some embodiments of the present disclosure, a package includes a device die, a molding material molding the device die therein, a through-via substantially penetrating through the molding material, wherein the through-via has an end. The end of the through-via is tapered and has rounded sidewall surfaces. The package further includes a redistribution line electrically coupled to the through-via.

In accordance with alternative embodiments of the present disclosure, a package includes at least one first dielectric layer, a first plurality of redistribution lines in the at least one first dielectric layer, a device die over and electrically coupled to the first plurality of redistribution lines, a molding material molding the device die therein, a through-via in the molding material, wherein a top end portion of the through-via has rounded sidewalls, at least one second dielectric layer over the device die, and a second plurality of redistribution lines in the at least one second dielectric layer. One of the second plurality of redistribution lines is electrically coupled to one of the first plurality of redistribution lines through the through-via.

In accordance with yet alternative embodiments of the present disclosure, a method includes forming a through-via over a carrier, placing a device die over the carrier, molding the device die and the through-via in a molding material, planarizing the molding material to expose at least one of the through-via and a metal pillar of the device die, and forming a metallic feature over the through-via. The metallic feature and the through-via form an interface therebetween. A top portion of the through-via adjacent to the interface has rounded sidewalls.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
   forming a conductive through-via over a carrier, wherein the conductive through-via comprises:
      a top portion, with the top portion being tapered and having rounded sidewalls; and
      a bottom portion having substantially vertical edges, with the top portion being narrower than the bottom portion;
   placing a device die over the carrier;
   encapsulating the device die and the conductive through-via in a molding material;

planarizing the molding material to expose at least one of the conductive through-via and a metal pillar of the device die, wherein the metal pillar is at a top surface of the device die; and forming a metallic feature over the conductive through-via, wherein the metallic feature and the conductive through-via form an interface therebetween.

2. The method of claim 1, wherein after the planarizing the molding material, a remaining portion of the conductive through-via has the rounded sidewalls and a planar top surface.

3. The method of claim 1, wherein after the conductive through-via is formed, the conductive through-via has a rounded top surface and additional rounded sidewalls, and the rounded top surface and the additional rounded sidewalls are removed in the planarizing, and the method further comprises:

after the planarizing and before the forming the metallic feature, etching the conductive through-via, wherein a remaining portion of the conductive through-via has the rounded sidewalls and an additional rounded top surface, wherein the metallic feature lands on the additional rounded top surface.

4. The method of claim 1, wherein after the planarizing the molding material, the conductive through-via is covered by a surface portion of the molding material.

5. The method of claim 4, wherein the forming the metallic feature comprises:

forming a dielectric layer over the molding material; and etching the dielectric layer and the molding material to form an opening, with a rounded top surface of the conductive through-via being exposed to the opening, wherein the metallic feature comprises a via in the opening, and a redistribution line over the dielectric layer.

6. The method of claim 1, wherein after the planarizing the molding material, the conductive through-via is exposed, and wherein the forming the metallic feature comprises:

etching the conductive through-via to recess the conductive through-via, with a recess formed in the molding material;

forming a dielectric layer over the molding material, wherein the dielectric layer extends into the recess;

etching the dielectric layer to expose the conductive through-via; and forming the metallic feature, wherein the metallic feature comprises a via in the recess, and a redistribution line over the dielectric layer.

7. The method of claim 6, wherein the etching the conductive through-via comprises a wet etching.

8. The method of claim 1, wherein the forming the conductive through-via comprises:

forming a seed layer over the carrier;

applying a photo resist over the seed layer;

forming an opening in the photo resist to expose the seed layer;

plating the conductive through-via in the opening; and removing the photo resist and a portion of the seed layer covered by the photo resist.

9. A method comprising:

forming a patterned photo resist;

plating a conductive feature in the patterned photo resist, wherein a lower portion of the conductive feature has sidewalls contacting the patterned photo resist, and an upper portion of the conductive feature is tapered, with sidewalls of the upper portion of the conductive feature being spaced apart from the patterned photo resist;

removing the patterned photo resist;

encapsulating the conductive feature in an encapsulating material;

performing a planarization on the encapsulating material, wherein after the planarization, at least a portion of the upper portion of the conductive feature remains; and forming a redistribution line over and in contact with the upper portion of the conductive feature.

10. The method of claim 9, wherein after the planarization, the conductive feature has a planar top surface.

11. The method of claim 10, wherein the redistribution line contacts the planar top surface.

12. The method of claim 9, wherein after the planarization, the encapsulating material has a portion covering the conductive feature, and the method further comprising:

etching the encapsulating material to form a recess extending into the encapsulating material, wherein the upper portion of the conductive feature is exposed through the recess.

13. The method of claim 12, wherein the redistribution line comprises a via portion extending into the recess to contact the upper portion of the conductive feature.

14. The method of claim 12, wherein the via portion contacts the upper portion of the conductive feature to form a rounded interface.

15. The method of claim 9, wherein the lower portion of the conductive feature has straight edges.

16. A method comprising:

forming a conductive feature over a carrier, the conductive feature comprising:

a first end portion having a vertical sidewall; and a second end portion having a rounded sidewall, wherein the rounded sidewall is continuously connected to the vertical sidewall;

placing a device over the carrier;

encapsulating the conductive feature and the device in an encapsulating material;

thinning the encapsulating material, the device, and the encapsulating material; and forming a redistribution line over and in contact with the second end portion of the conductive feature.

17. The method of claim 16, wherein in the thinning, a first portion of the second end portion is removed, and a second portion of the second end portion remains after the thinning the encapsulating material.

18. The method of claim 16, wherein an entirety of the conductive feature remains after the thinning.

19. The method of claim 18 further comprising etching the encapsulating material to expose the second end portion.

20. The method of claim 19, wherein after the etching the encapsulating material, a recess is formed in the encapsulating material, and the redistribution line comprises a via portion extending into the recess.

* * * * *